United States Patent
Lin et al.

(10) Patent No.: US 6,514,673 B2
(45) Date of Patent: Feb. 4, 2003

(54) RULE TO DETERMINE CMP POLISH TIME

(75) Inventors: Hway-Chi Lin, Hsin-Chu (TW); Yu-Ku Lin, Hsin-Chu (TW); Wen-Pin Chang, Tao-Yuan (TW); Ying-Lang Wang, Taichung Country (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 50 days.

(21) Appl. No.: 09/818,962

(22) Filed: Mar. 28, 2001

(65) Prior Publication Data

US 2002/0090745 A1 Jul. 11, 2002

Related U.S. Application Data

(62) Division of application No. 09/318,471, filed on May 25, 1999, now Pat. No. 6,232,043.

(51) Int. Cl.[7] .................................................. G03F 7/00
(52) U.S. Cl. ......................... 430/317; 430/313; 216/17; 438/691
(58) Field of Search ................................ 430/313, 317, 430/322, 323; 216/17, 41; 438/691

(56) References Cited

U.S. PATENT DOCUMENTS

| | | | |
|---|---|---|---|
| 5,234,868 A | 8/1993 | Cote | 437/225 |
| 5,298,110 A | 3/1994 | Schoenborn et al. | 156/626 |
| 5,552,996 A | 9/1996 | Hoffman et al. | 364/468.28 |
| 5,659,492 A | 8/1997 | Li et al. | 364/569 |
| 5,665,199 A | 9/1997 | Sahota et al. | 438/14 |
| 5,763,310 A * | 6/1998 | Gardner | 438/270 |
| 5,834,359 A * | 11/1998 | Jeng | 438/425 |
| 5,851,899 A * | 12/1998 | Wiegand | 438/427 |
| 5,882,983 A * | 3/1999 | Gardner | 438/424 |
| 5,904,539 A * | 5/1999 | Hause | 438/427 |
| 5,981,354 A * | 11/1999 | Spikes | 438/424 |
| 5,981,357 A * | 11/1999 | Hause | 438/427 |
| 6,080,620 A * | 6/2000 | Jeng | 438/253 |
| 6,087,705 A * | 7/2000 | Gardner | 257/710 |

* cited by examiner

*Primary Examiner*—Kathleen Duda
(74) *Attorney, Agent, or Firm*—George O. Saile; Stephen B. Ackerman

(57) ABSTRACT

A simple method for calculating the optimum amount of HDP deposited material that needs to be removed during CMP (without introducing dishing) is described. This method derives from our observation of a linear relationship between the amount of material that needs to be removed in order to achieve full planarization and a quantity called "OD for CMP density". The latter is defined as PA×(100−PS) where PA is the percentage of active area relative to the total wafer area and PS is the percentage of sub-areas relative to the total wafer area. The sub-areas are regions in the dielectric, above the active areas, that are etched out prior to CMP. Thus, once the materials have been characterized, the optimum CMP removal thickness is readily calculated for a wide range of different circuit implementations.

9 Claims, 2 Drawing Sheets

RULE TO DETERMINE CMP POLISH TIME

This is a division of patent application Ser. No. 09/318,471, filing date May 25, 1999, now U.S. Pat. No. 6,232,043 Rule To Determine Cmp Polish Time, assigned to the same assignee as the present invention.

FIELD OF THE INVENTION

The invention relates to the general field of chemical mechanical planarization with particular reference to planarizing shallow trenches that have been over filled with HDP oxide.

BACKGROUND OF THE INVENTION

With the growing need for higher densities in integrated circuits, the STI (shallow trench isolation) process has gradually replaced the LOCOS (local oxidation of silicon) process. The STI process begins with the formation of shallow trenches in the surface of the silicon wafer following which these trenches are over-filled with a suitable dielectric material, typically silicon oxide, the excess being then removed by means of CMP (chemical mechanical polishing). In principle, the advancing etch front during CMP should be flat and independent of the initial surface contours, hence its popularity for planarization. In practice, however, the advancing front is not always as flat as would be desired, being influenced as much by the nature of the materials being etched as by the initial surface contour. For example, the CMP removal rate of an oxide layer will be lower where it is underlaid by another layer of oxide and higher where it is underlaid by a layer of metal.

As a consequence, the amount of material that is removed after CMP, as well as the time needed to remove it, will vary from one wafer to the next if the underlying metal patterns (which in turn depend on the particular technology and circuits that are being implemented) are different.

Clearly, it is possible to determine the optimum polishing time for any given class of wafers by purely empirical means such as conducting a test run involving several different polishing times each time a new wafer design is to be implemented. Pilot runs of this type are, however, very time-consuming (typically 8–10 hours), rendering this approach expensive, particularly if the technology being calibrated is not to be manufactured in large quantities.

There have, therefore, been a number of suggested approaches as to how to determine the optimum polishing time (i.e. the optimum amount of dielectric to be removed) without the need to go through a pilot run.

For example, Li et al. (U.S. Pat. No. 5,659,492) measure the times to first break through the film being polished. Then the time to completely remove the film is measured and the two numbers are added to give the total required polishing time.

Cote (U.S. Pat. No. 5,234,868) determines an end point for CMP by using an underlayer of different visual appearance from the layer that is being removed.

Schoenborn et al. (U.S. Pat. No. 5,298,110) first measure removal rates inside and outside the trenches to determine their relative polishing rates. This information is used to predict optimum polishing times for future wafers.

Sahota et al. (U.S. Pat. No. 5,665,199) first polish at least two test wafers then measure the amount removed in four selected locations so as to characterize the extent of polish rate variation across the wafer. They then use this data to determine the optimum polishing time.

Hoffman et al. (U.S. Pat. No. 5,552,996) divide the wafer surface up into a number of sub-regions. Optimum polishing time is determined for each sub-region and this data is then used to compute an optimum polishing time for a full wafer.

All of these approaches, while possibly representing an improvement over a full blown pilot study, are still very time-consuming. The present invention presents an approach that involves two hours or less to implement but that nevertheless provides a highly reliable guide as to how much material is to be removed in any particular case.

SUMMARY OF THE INVENTION

It has been an object of the present invention to provide a method for achieving shallow trench isolation in minimal time with little or no dishing at the surfaces of the trenches.

Another object of the invention has been to provide a simple formula whereby the required amount of HDP oxide needed to achieve planarization can be readily computed from several easily determined quantities.

These objects have been achieved by noting that there is a linear relationship between the amount of material that needs to be removed in order to achieve full, but dishing free, planarization and a quantity called "OD for CMP density". The latter is defined as $PA \times (100 \times PS)$ where PA is the percentage of active area relative to the total wafer area and PS is the percentage of sub-areas relative to the total wafer area. The sub-areas are regions above the active areas that are etched out of the dielectric prior to CMP. Thus, once the materials have been characterized, the optimum CMP removal thickness is readily calculated for a wide range of different circuit implementations.

DESCRIPTION OF THE PREFERRED EMBODIMENTS

Figure 1:
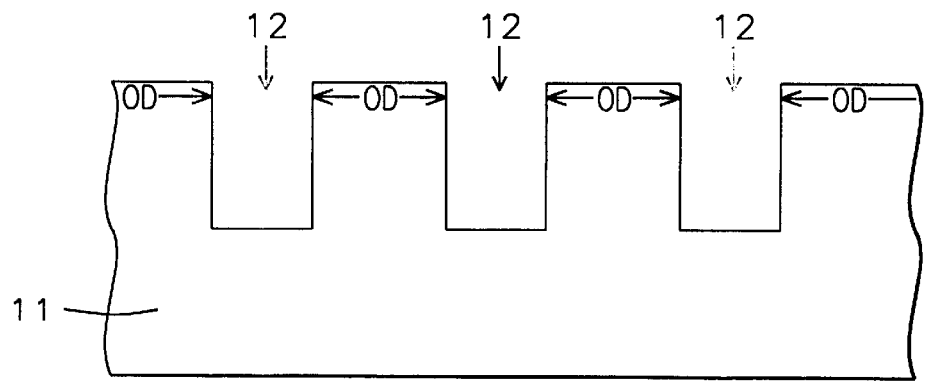
FIG. 1 is a cross-section of part of a silicon wafer in which shallow trenches have been etched.

Referring now to FIG. 1, we show, in schematic cross-section, a portion of a silicon wafer 11 in which shallow trenches 12 have been etched. The areas between the trenches (i.e. the un-etched surface of the wafer) are referred to as active areas (shown as OD in the figure) as that is where devices of various kinds will be formed.

Once the trenches are in place, they are then over-filled with a dielectric material, typically to a thickness between about 5,400 and 6,600 Angstroms. To deposit this dielectric HDPCVD. (high density plasma chemical vapor deposition) is often preferred because it has good gap filling capability and gives good uniformity both within as well as between wafers. Although dielectric deposited by a HDP process fills the trenches without trapping voids, the resulting surface contour is very uneven, as illustrated in FIG. 2 where HDP layer 22a is shown after a material such as silicon oxide or polysilicon has been laid down.

Figure 2:
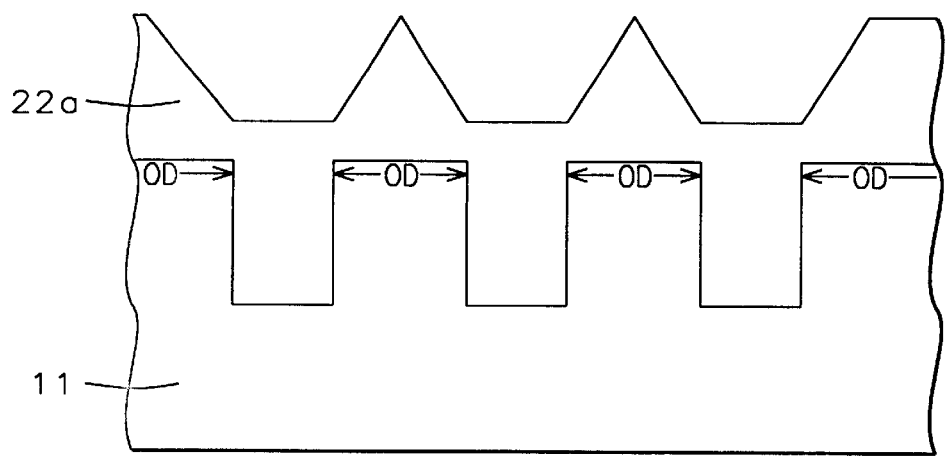
FIG. 2 is a cross-section of shallow trenches that have been over filled with HDP oxide.

If a wafer covered with a layer of dielectric, having a surface profile such as shown in FIG. 2, is then subjected to CMP, by the time the active areas had been completely cleared of dielectric, significant dishing of the material inside the trenches will have occurred. In order to avoid this, partial etching of the HDP layer is performed prior to CMP. The mask that is used in patterning the photoresist is the reverse of the mask that was used to etch the trenches and the material above the active area, with the added proviso that the areas removed are somewhat smaller than the active areas. The portions of the HDP layer that get removed have been labeled ODR in FIG. 3 which shows the appearance of the HDP layer 22b after etching has taken place. In general, the ratio of any given sub-area (ODR) to its corresponding active area (OD) is between about 0.2 and 0.8:1.

Figure 3:
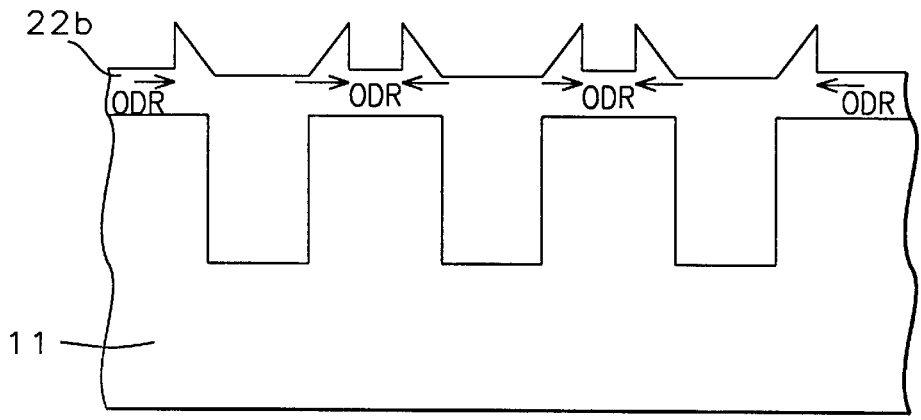
FIG. 3 shows the cross-section of FIG. 2 after a part of the excess HDP oxide has been removed prior to CMP.

Thus, given the profile shown in FIG. 3, the problem that is to be solved by the method of the present invention is how to provide a simple rule for determining how much more material is to be removed by CMP so that, at its completion, the active areas will be clear of insulation while the trenches will be fully filled without the presence of any dishing.

The principle on which the present invention is based is our observation that there is a linear relationship between the optimum thickness of dielectric to be removed through CMP and a quantity that we will call "OD for CMP density". Before defining the latter we need to define several other quantities:

PA is the percentage of active areas (OD) relative to the total wafer area.

PS is the percentage of the sub-areas (ODR) relative to the total wafer area.

"OD for CMP density" can now be defined as PA×(100−PS).

Figure 4:
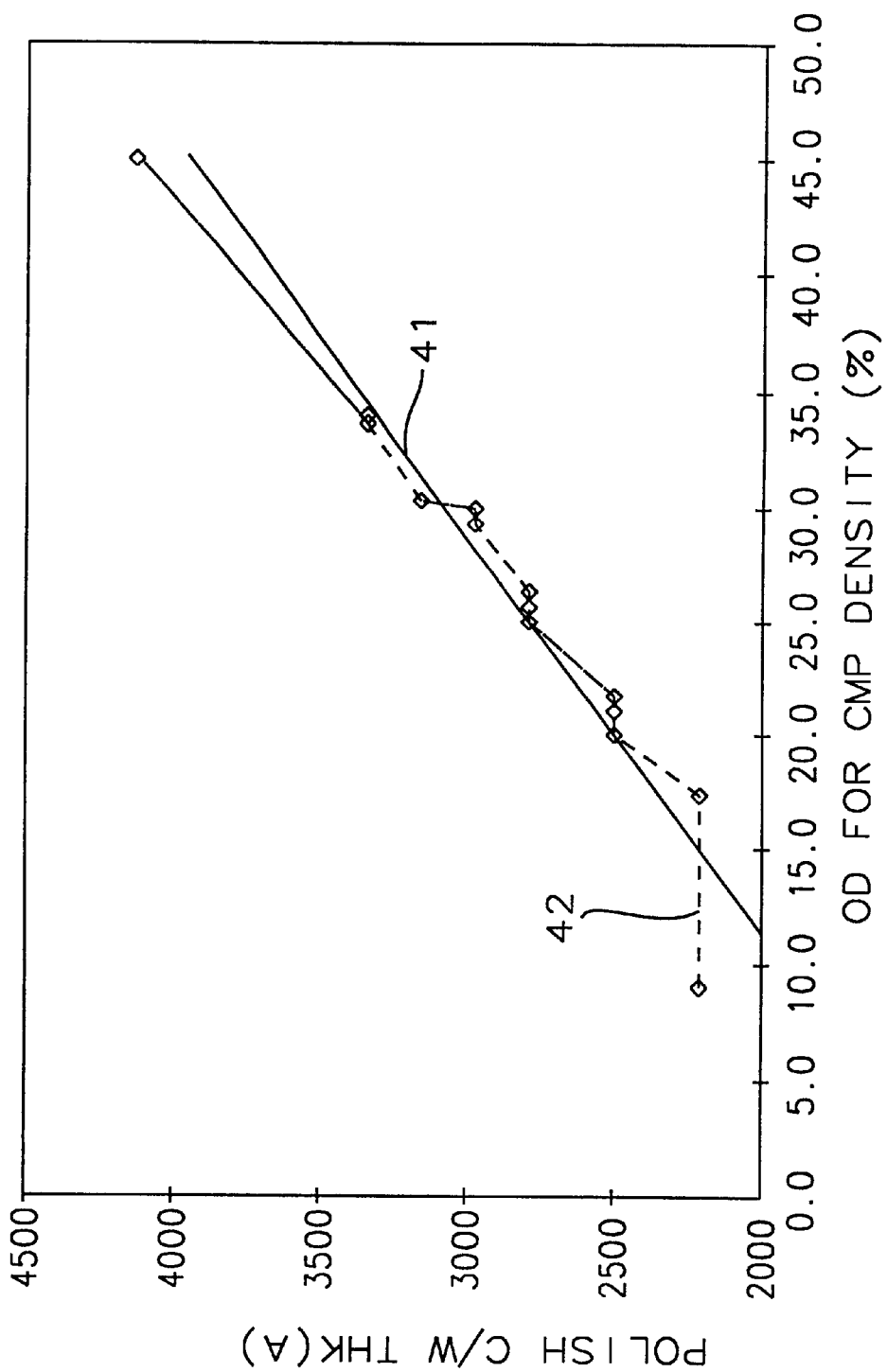
FIG. 4 is a plot of "OD for CMP density" as a function of the required amount of filler dielectric that is to be removed from a control wafer.

The aforementioned linear relationship between "OD for CMP density" and the optimum thickness to be removed (for a control wafer) is illustrated in FIG. 4 where curve 42 is actual experimental data for which straight line curve 41 is a close fit. Once this relationship is known, it is then possible to derive an expression for OT, the optimum thickness of dielectric material that is to be removed:

$$OT=\{K1\times PA\times(100-PS)\}+K2,$$

where K1 and K2 are experimentally determined constants (readily read off curves such as 41 in FIG. 4). Their particular values will depend on the properties of the STI dielectric material as well as on the CMP removal rate.

In general, K1 will be in the range of from about 0.5 to 0.7 Angstroms, while K2 will be in the range of about 1,000 to about 2,500 Angstroms.

Both PA and PS are readily obtained from the computer mask data base. This takes less than 10 minutes, enabling us to complete the CMP process in less than 2 hours. Typically, PA is between about 20 and 50% while PS is between about 10 and 30%.

It takes less than 10 minutes to obtain values for PA and PS (available on our in-house company network) so that OT can be determined very quickly, enabling the final CMP step to be implemented with a minimum of delay while at the same time ensuring that all dielectric gets removed from the active areas without introducing any dishing effects in the dielectric material inside the trenches. Typical values for OT are in the range of from about 2,000 to 4,000 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method for predicting an optimum thickness, OT, of dielectric material that is to be removed from an integrated circuit wafer, said wafer having a total area, active areas, and shallow trenches that have been overfilled with said dielectric, comprising:

providing a first mask, suitable for photolithography, that defines the shallow trenches and the active areas;

determining the percentage, PA, of said active areas relative to the total area;

providing a second mask, suitable for photolithography, whereby sub-areas, wholly within and of lesser area than, said active areas may be selectively etched away;

determining the percentage, PS, of said sub-areas relative to the total area; and computing OT from a formula OT={K1×PA×(100−PS)}+K2, where K1 and K2 are slope and Y intercept, respectively, read off an experimental plot of OT versus PA×(100−PS).

2. The method of claim 1 wherein K1 is between about 0.5 and 0.7 Angstroms.

3. The method of claim 1 wherein K2 is between about 1,000 and 2,500 Angstroms.

4. The method of claim 1 wherein the ratio of any given sub-area to its corresponding active area is between about 0.2:1 and 0.8:1.

5. The method of claim 1 wherein said optimum thickness of dielectric is between about 2,000 and 4,000 Angstroms.

6. The method of claim 1 wherein PA is between about 20 and 50%.

7. The method of claim 1 wherein PS is between about 10 and 30%.

8. The method of claim 1 wherein the step of determining PA further comprises:

determining an amount of light transmitted by said first mask relative to an amount of light transmitted through a clear area of similar size.

9. The method of claim 1 wherein the step of determining PS further comprises:

determining an amount of light transmitted by said second mask relative to an amount of light transmitted through a clear area of similar size.

* * * * *